(12) United States Patent
Allott et al.

(10) Patent No.: US 10,439,623 B2
(45) Date of Patent: Oct. 8, 2019

(54) INJECTION LOCKED OSCILLATOR SYSTEM AND PROCESSES

(71) Applicant: GLOBALFOUNDRIES INC., Grand Cayman (KY)

(72) Inventors: Stephen Allott, Scotts Valley, CA (US); Julian Jenkins, Kurraba Point (AU)

(73) Assignee: GLOBALFOUNDRIES INC., Grand Cayman (KY)

( * ) Notice: Subject to any disclaimer, the term of this patent is extended or adjusted under 35 U.S.C. 154(b) by 62 days.

(21) Appl. No.: 15/801,735

(22) Filed: Nov. 2, 2017

(65) Prior Publication Data

US 2018/0351563 A1 Dec. 6, 2018

Related U.S. Application Data

(60) Provisional application No. 62/512,391, filed on May 30, 2017.

(51) Int. Cl.
| | |
|---|---|
| *H03L 7/00* | (2006.01) |
| *H03L 7/099* | (2006.01) |
| *H03L 7/08* | (2006.01) |
| *H03L 7/24* | (2006.01) |

(52) U.S. Cl.
CPC .......... *H03L 7/0992* (2013.01); *H03L 7/0802* (2013.01); *H03L 7/24* (2013.01)

(58) Field of Classification Search
CPC .................................................... H03L 7/0992
USPC ........................................................ 331/1 R
See application file for complete search history.

(56) References Cited

U.S. PATENT DOCUMENTS

| | | |
|---|---|---|
| 7,003,274 B1 | 2/2006 | Olip |
| 7,414,443 B2 | 8/2008 | Jacobsson et al. |
| 8,384,485 B2 | 2/2013 | Fortier et al. |
| 8,704,603 B2 | 4/2014 | Taghivand et al. |
| 2013/0249612 A1* | 9/2013 | Zerbe .................... H04L 7/0079 327/161 |

OTHER PUBLICATIONS

Taiwanese Office Action in related TW Application No. 107106797 dated Oct. 2, 2018, 8 pages.
P. Park, J. Park, H. Park and S. Cho, "An all-digital clock generator using a fractionally injection-locked oscillator in 65nm CMOS," 2012 IEEE International Solid-State Circuits Conference, San Francisco, CA, 2012, 2 pages.
Taiwanese Notice of Allowance in related TW Application No. 107106797 dated Jan. 19, 2019, 4 pages.

* cited by examiner

*Primary Examiner* — Joseph Chang
(74) *Attorney, Agent, or Firm* — David Cain; Andrew M. Calderon; Roberts Mlotkowski Safran Cole & Calderon, P.C.

(57) ABSTRACT

The present disclosure relates to an injection locked oscillator system and processes and, more particularly, to structures and processes for generating an inductor-less frequency multiplier using injection locking and histogram calibration with a back-gate process. The structure includes injection locked oscillator (ILO) system which is structured to provide a local oscillator (LO) and a Digitally Controlled Oscillator (DCO) or Voltage Controlled Oscillator (VCO) frequency which is not harmonically related by an integer multiple to an output frequency.

19 Claims, 3 Drawing Sheets

INJECTION LOCKED OSCILLATOR SYSTEM AND PROCESSES

FIELD OF THE INVENTION

The present disclosure relates to an injection locked oscillator system and processes and, more particularly, to structures and processes for generating an inductor-less frequency multiplier using injection locking and histogram calibration with a back-gate process.

SUMMARY

In an aspect of the disclosure, a structure comprises an injection locked oscillator (ILO) system which is structured to provide a local oscillator (LO) and a Digitally Controlled Oscillator (DCO) or Voltage Controlled Oscillator (VCO) frequency which is not harmonically related by an integer multiple to an output frequency.

In an aspect of the disclosure, a method comprises calibrating a free running frequency of an ILO using a calibration counter to compare a frequency of the ILO with a desired frequency output from a frequency control word (FCW).

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to an injection locked oscillator system and processes and, more particularly, to structures and processes for generating an inductor-less frequency multiplier (non-integer frequency multiplier) using injection locking and histogram calibration with a back-gate process. More specifically, the present disclosure provides a low power system capable of providing a local oscillator (LO) and a Digitally Controlled Oscillator (DCO) or Voltage Controlled Oscillator (VCO) frequency which is not harmonically related by a rational multiple. The use of DCO or VCO is interchangeable in this description. The structures and processes described herein can be used for ultra-low power designs with integrated power amplifiers, which can be implemented in Fully Depleted Silicon on Insulator (FDSOI) technology.

Advantageously, in embodiments, the structures described herein do not include inductors with co-existence of an on-chip power amplifiers and DCO.

The presence of an on-chip power amplifier (PA) requires that a fractional, preferably non-integer numbers, frequency multiplication of a DCO be performed to move the local oscillator (LO) frequency away from the DCO center frequency and hence avoid corruption of the phase accuracy during transmit conditions. In implementation, technologies with good electrical isolation (e.g., FDSOI) offer an excellent platform to integrate high power amplifier circuits on the same silicon as sensitive structures such as DCOs. However, further measures of isolation are required such as making the DCO frequency and power amplifier output frequency non-integer harmonically related. In accordance with the disclosure, this can be accomplished by multiplying the DCO frequency by a ratio of rational numbers (non-integers) using the structures and processes described herein.

Conventional systems use bandpass filters for multiplying the DCO frequency. The present disclosure, though, avoids the use of bandpass filters and hence inductors. Instead, a state machine (structures described herein) is utilized to provide a wide tuning range with little or no impact on the frequency response. For example, in embodiments, an injection locked divider can utilize a back gate voltage in the FDSOI processes to achieve the benefits described herein. Furthermore, the use of digital structures lends itself well to FDSOI technologies as any necessary calibration can utilize the back gate potential.

Figure 1:
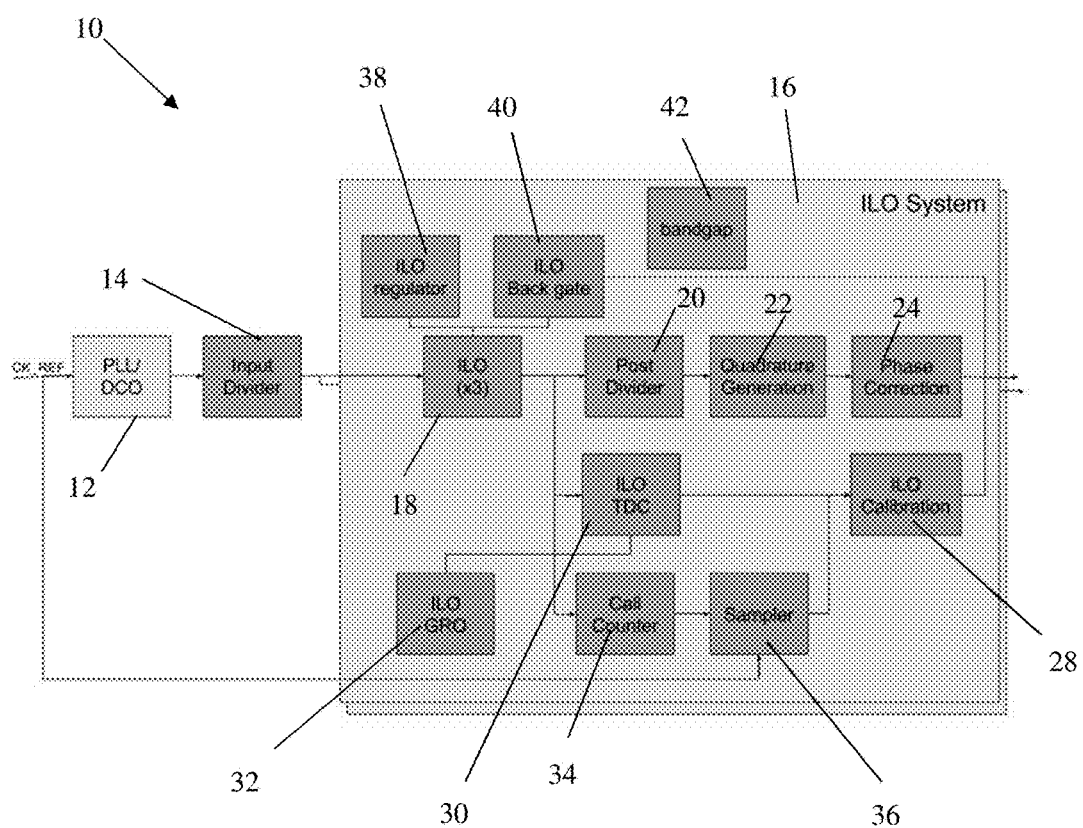
FIG. 1 shows a block diagram of a mixer with an injection locked oscillator (ILO) system and its connection to a PLL DCO via a programmable input divider in accordance with aspects of the present disclosure.

FIG. 1 shows a block diagram of a mixer with an injection locked oscillator (ILO) system 16 and its connection to a PLL DCO 12 via a programmable input divider 14. In embodiments, the ILO system 16 can be duplicated several times (n+1). The ILO system 16 can be split into two parts: (i) the input divider 14 and (ii) the remaining components within the block labeled with reference numeral 16, e.g., ILO 18, ILO calibration 28, post divider 20, quadrature generation 22, etc. This allows the system 16 to minimize clock distribution current. For example, the lowest frequency clock of the system 16, at the output of the input divider 14, can be distributed and the higher speed clocks, at the output of the ILO 18, can be generated locally (within the ILO system 16). This minimizes errors in the quadrature clocks 22 due to clock mismatch. Also, it is possible for the low speed clock from the input divider 14 to be distributed to both the TX and RX, where individual clocks of the correct frequency are generated.

In embodiments, the PLL DCO 12 (external to the ILO system 16) supplies an input clock signal to the input divider 14. The input divider 14 (which may be part of the ILO system 16) divides the PLL output clock to generate the input clock to the ILO system 16. In more specific embodiments, the input divider 14 takes a differential clock from the PLL DCO 12 and divides it by a number between, e.g., 2 and 16, and generates a differential output clock for injection into the ILO system 16, e.g. ILO 18. Note that division ratios that are multiples of 3 should be avoided so that the overall system can generate non-integer ratios after the ILO 18 multiples the input by 3×. The input divider 14 is enabled or disabled by the ILO calibration 28 and its divide ratio can be set by a N_PRE_DIV input.

The ILO 18 is a three stage ring oscillator capable of generating output frequencies from 2 GHz to 6 GHz, as illustrative examples, under the control of its supply voltage and back gate voltages. The ILO 18 can generate an output signal three times (3×) the frequency of its input signal.

When no injection clock is supplied from the input divider 14, the ILO 18 will free run to allow a startup calibration to set an initial frequency as described with reference to FIG. 4. When a clock is supplied from the input divider 14, that is within the lock range (for that free running frequency), the ILO 18 will lock to generate a frequency three times the input frequency as described further herein. The Vdd and back gate voltages of the ILO 18 are determined by the ILO calibration 28 as described below.

A post divider 20 divides the output of the ILO 18 by an integer, e.g., 2, 4, 8, 16 or 32, to generate a quadrature output clock with four (4) phases separated by approximately 90 degrees. The output phases are determined by the rising and falling edges in the ILO output clock. A quadrature generator 22 (which may be part of the post divider 20) generates four phases of a quadrature clock.

A phase correction 24 adjusts the output phases of the quadrature generator 22 to be within 1 degree of their target values. More specifically, the phase correction 24 is used to tune the output of the quadrature generator 22 to have an optimal relation between the in phase and quadrature clocks. This phase correction 24 can adjust the input phase difference by up to, e.g., ±5 ps in ~250 fs steps. And, it should be noted that the range may increase if required. The phase steps are guaranteed to be monotonic, but will have significant differences between steps. The output of the phase correction circuit 24 provides a 1.5× frequency multiplication of the input to the ILO system 16 and does so in the I/Q domain.

In embodiments, the phase change is controlled by a PH_ADJUST signal. Increasing the value of the PH_ADJUST signal makes the quadrature phase later. This input is intended to be generated by the phase correction 24 receiving the quadrature clock which can use internal measures to optimize this phase relationship. This phase correction range is sufficient to correct internal mismatch, plus an allowance for wiring mismatch within the target circuit.

In embodiments, the ILO calibration 28 tunes the ILO frequency by adjusting the codes (signals) controlling an ILO regulator 38 and ILO back gate 40, based on inputs from the ILO time to digital converter (TDC) 30 and calibration counter 34 as described herein. For example, the ILO calibration 28 sets the free running frequency of the ILO 18 to minimize modulation by the incoming clock and maximize the jitter transfer bandwidth. In more specific implementations, the ILO TDC 30 measures the modulation of the ILO clock by the input clock to allow the ILO calibration 28 to tune the free running frequency of the ILO 18, thereby minimizing modulation. The ILO TDC 30 should accept clock signals from the ILO 18 up to 6 GHz. An ILO GRO 32 supplies a low speed clock that is unsynchronized to the ILO output or reference clock input which, in turn, is used by the ILO TDC 30.

A cali(bration) counter 34 (e.g., three state counter) counts the three ILO clock cycles per injection clock and a sampler 36 samples this count using the clock from the ILO GRO 32 to achieve a sampling that is unsynchronized to the ILO clock. Unsynchronized sampling means that the probability of a sample being captured is proportional to the probability of being in that state. Hence the ILO calibration 28 can determine the difference in period caused to the ILO 18 by the injection pulse and act to minimize this period difference by tuning the free running frequency of the ILO to match its locked value. In embodiments, the counter 34 and the sampler 36 can be combined into a single module. The counter 34 and sampler 36 can also be the same one used in a PLL feedback counter.

By way of more specific explanation, the counter 34 and sampler 36 are used to measure the ratio of the reference clock frequency to the ILO frequency to allow the ILO calibration 28 to set the free running frequency as accurately as possible before the ILO 18 is locked. For example, in startup mode, the counter 34 is used by the ILO calibration 28 to determine the ratio between the frequencies of the ILO clock and the reference clock to allow the ILO clock to be set to a desired multiple. The counter 34 should operate with input frequencies between 2 and 6 GHz, as illustrative examples. Illustratively, the counter 34 increments a counter on each incoming clock from the ILO 18, and presents a value that will be sampled (by the sampler 36) reliably, even near the time when the output is changing. This may require taking different samples or controlling the timing of sampling. The sampler 36 captures this value on the rising edge of the reference clock.

The ILO regulator 38 is controlled by the ILO calibration 28 to coarsely set the ILO output frequency by controlling its Vdd. That is, the ILO regulator 38 supplies the Vdd for the ILO 18, under the control of the ILO calibration 28, which is used for coarse tuning of the ILO frequency during startup. The ILO regulator 38 should have a tuning step that is less than 10 mV across all PVT. For example, its range should span 200 mV to 600 mV. The ILO regulator 38 should also supply 300 µA to the ILO 18. In embodiments, the input voltage is 800 mV+−5% and the supply voltages will be 800 mV. The input reference voltage from the bandgap will be 200 mV. Lastly, the output stage can be NFET or PFET.

The ILO back gate 40 is controlled by the ILO calibration 28 to set the ILO free running frequency more finely, e.g., fine tuning of the ILO frequency during startup and background calibration. By way of example, the ILO back gate 40 supplies the back gate voltages (for both NFETs and PFETs in FDSOI) for the ILO 18, under the control of the ILO calibration 28. The ILO back gate 40 should have a tuning step that is less than 2 mV across all PVT, with a range span of at least ±1V. A bandgap 42 provides a reference for the ILO regulator 38 and ILO back gate 40.

Figure 2:
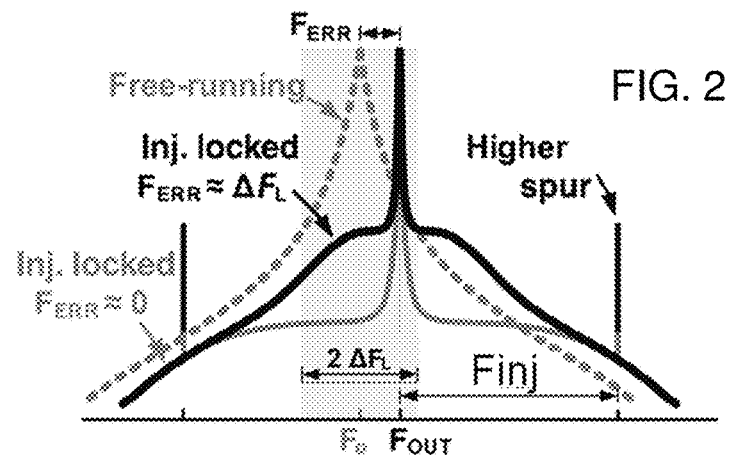
FIG. 2 shows a graph depicting different modes of operation according to aspects of the present disclosure.

FIG. 2 shows a graph depicting different modes of operation according to aspects of the present disclosure. Specifically, FIG. 2 shows a free running mode (labeled free running), which is calculated during start up, an injection locked mode where $F_{ERR}$ is approximately equal to $\Delta F_L$, and an injection locked mode where $F_{ERR}$ is approximately equal to "0". $F_{ERR}$ is the drift in output frequency without any calibration. Barr represents the frequency output due to injection from the PLL/DCO. As shown in FIG. 2, a difference in injected cycle appears as a spur at the injection frequency (400 MHz-1 GHz). Calibrating the free running frequency of the ILO 18 minimizes the spur. Also, calibrated ILO output spectrum is most like injection signal spectrum and reduces the phase noise at the output.

Figure 3:
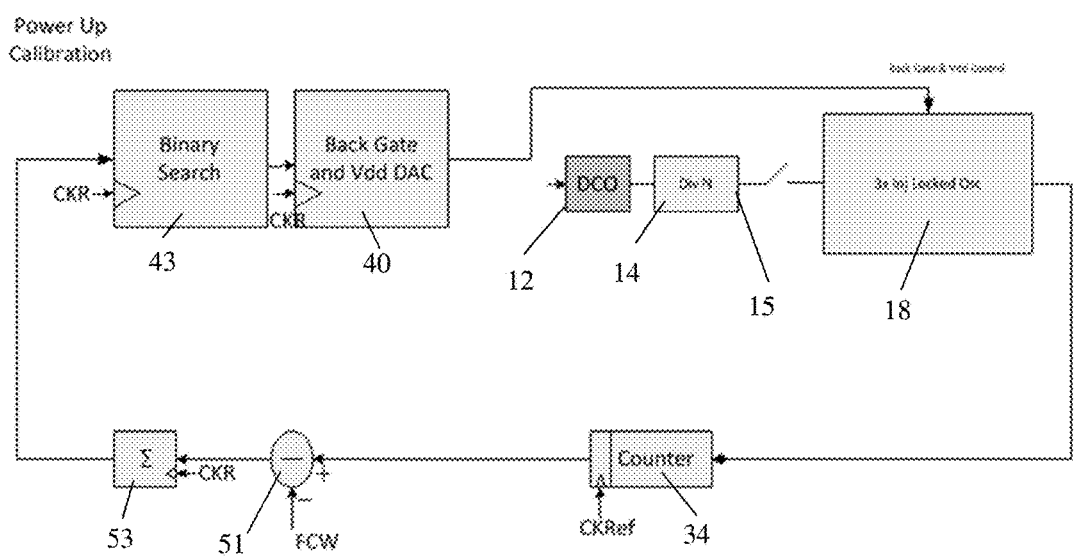
FIG. 3 shows a block diagram containing the ILO configured for startup calibration in accordance with aspects of the present disclosure.

FIG. 3 shows a block diagram containing the ILO configured for startup calibration. In this mode, the output of the PLL/DCO 12 is set into free running mode by isolating the ILO 18, e.g., disabling the injection. The isolation of the ILO 18 is provided by disabling the pre-divider 14 indicated by the open switch 15.

In embodiments, the free running frequency of the ILO 18 can be calibrated using the calibration counter 34 and the sampler 36 (not shown) to compare the ILO frequency with a desired frequency output from a frequency control word (FCW) 51 (which is constant for a given output frequency). In this manner, the output from the counter 34 can be used to determine whether the ILO 18 is running fast or slow. The edges of the frequencies, e.g., different states, are accumulated at reference numeral 53. The binary search 43 then performs binary searches on the coarse (Vdd) and fine (back gate) controls to set the optimal frequency. That is, the binary search 43 can generate digital codes that are used to control the Vdd and back gate voltage, e.g., VDD DACs 40 (e.g., ILO regulator and ILO back gate shown in FIG. 1). In embodiments, the binary search 43 can be a calibration algorithm that calibrates the ILO 18 to have the correct Vdd and back gate voltages with an optimum free running oscillation frequency and hence minimum phase noise when locked. This can be independent of the PLL/DCO while the PLL/DCO is locked.

Figure 4:
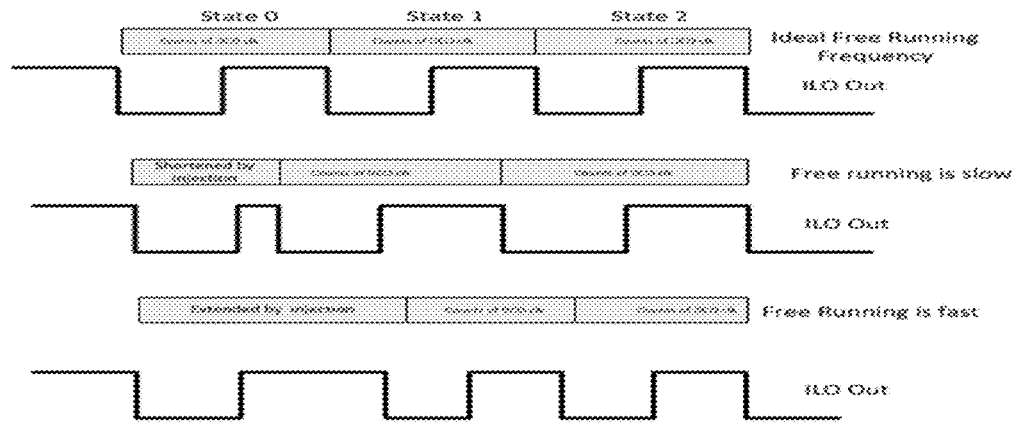
FIG. 4 shows a pictorial representation of a state machine used within background calibration and the effects of the free running frequency of the ILO to assess a direction to calibrate the ILO in accordance with aspects of the present disclosure.
Figure 5:
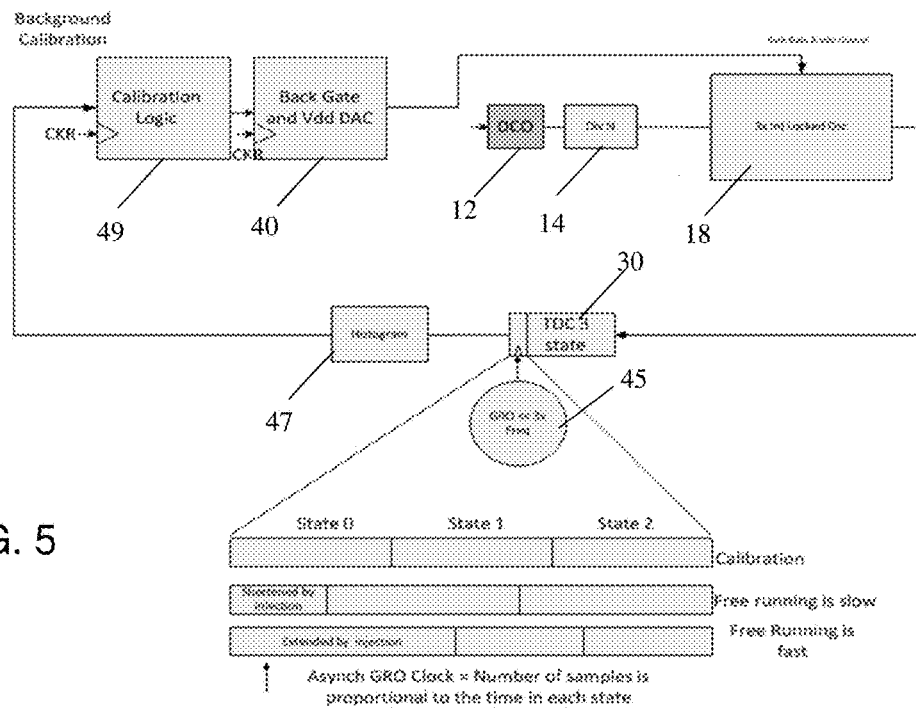
FIG. 5 shows a schematic enabling background calibration in accordance with aspects of the present disclosure.

In a background calibration mode, the injection of the input signal of the PLL/DCO is enabled via the input divider 14 (see, e.g., FIG. 5). The counter 34 (which can also include the sampler 36 of FIG. 1) then samples the output of the ILO 18 periodically and generates a histogram of how much time is spent in the injection cycle or free running cycles as shown in FIG. 4.

FIG. 4 shows a pictorial representation of a histogram to assess a direction to calibrate the ILO 18. As should be understood by those of skill in the art, with no injection from the PLL/DCO 12, the cycles are the natural oscillation frequency of the ILO 18, with the number of clock cycles counted in each state being roughly equal (e.g., state 0, 1, 2 being equal). But, in the case when the PLL/DCO is enabled, the frequency of oscillation may be incorrect.

In accordance with aspects described herein, injection of a signal at ⅓ the ILO frequency can be used to lengthen or shorten the time of one state (e.g., state 0) to make the average frequency correct as shown in FIG. 4. For example, state 0 can be shortened when free running is slow; whereas, state 0 can be lengthened when free running is fast. It should be understood that the desired frequency is known and is represented by the Frequency Control Word (FCW) as shown in the first row of the histogram, labeled calibration. By making such an adjustment to the edges of state 0 as shown in the next two rows, the beginning of state 0 to the end of state 2 will always have the same time (as the desired frequency) to obtain, in turn, the correct frequency. The more sampling that is performed, the more accurate the final result. And as should be understood by those of skill in the art, the objective is, based on the histogram data about these states, to control the frequency of the ILO 18 to ensure that the time in all states is equal. This will result in a difference between the injected cycle period and free running periods when the ILO 18 is not fully calibrated.

FIG. 5 shows a schematic enabling background calibration in accordance with aspects of the present disclosure. In this mode, the injection from the PLL/DCO 12 is enabled via the input divider 14. Additionally, in this mode, the post divider, quadrature generation and phase correction shown in FIG. 1 are active but not in the loop shown in FIG. 5. Also, the ILO regulator output remains fixed at the startup value.

As shown in FIG. 5, the output of the PLL/DCO is provided to the divider 14, which is then injected as an input to the ILO 18. As noted already herein, the ILO output is 3× its input frequency, which is used to clock the TDC 3 state counter 30 (e.g., ILO TDC of FIG. 1). The ILO TDC 30 samples the output periodically and generates a histogram (as shown in FIG. 4) of how much time is spent in the injection cycle or free running cycles. For example, in embodiments, the output of the counter 30 is sampled by the output of the gated ring oscillator (GRO) 32 (e.g., ILO GRO of FIG. 1) and this sampled output is processed to provide the histogram 47 which is passed to the calibration logic 49 that determines the appropriate changes to the back gate voltages to maintain the ILO 18 at the optimum state. In embodiments, the ILO TDC sampling clock is uncorrelated with the ILO clock (noise helps to randomize the TDC samples) by using the internal GRO 45. The sample number in each state is the same by tuning the fine control (backgate) 40 (e.g., ILO back gate of FIG. 1).

By way of more specific example and referring to Table 1 below, staring with a DCO frequency of 7 GHz toleranced to 12%, Row 7 shows the input frequency is from 6.160 GHz to 7.84 GHz. This is driven into a divide by 8 resulting in an output frequency of 0.770 GHz to 0.980 GHz. This then is passed to the ILO which generates a X3 output, taking the frequency from 2.310 GHz to 2.940 GHz, which is then followed by a divide by 1 to the output. The resulting division of the DCO frequency, from 7.840 GHz to 2.940 GHz for example, is a number of 2.6666 recurring.

TABLE 1

| Min (Ghz) | Max (GHz) | Divide | Min (Ghz) | Max (GHz) | Multiply | Min (Ghz) | Max (GHz) |
|---|---|---|---|---|---|---|---|
| 6.160 | 7.840 | 8 | 0.770 | 0.980 | 3 | 2.310 | 2.940 |
| 6.160 | 7.840 | 10 | 0.616 | 0.784 | 3 | 1.848 | 2.352 |
| 6.160 | 7.840 | 11 | 0.560 | 0.713 | 3 | 1.680 | 2.138 |
| 6.160 | 7.840 | 13 | 0.474 | 0.603 | 3 | 1.422 | 1.809 |
| 6.160 | 7.840 | 14 | 0.440 | 0.560 | 3 | 1.320 | 1.680 |
| 6.160 | 7.840 | 8 | 0.770 | 0.980 | 3 | 2.310 | 2.940 |
| 6.160 | 7.840 | 10 | 0.616 | 0.784 | 3 | 1.848 | 2.352 |
| 6.160 | 7.840 | 11 | 0.560 | 0.713 | 3 | 1.680 | 2.138 |
| 6.160 | 7.840 | 13 | 0.474 | 0.603 | 3 | 1.422 | 1.809 |
| 6.160 | 7.840 | 14 | 0.440 | 0.560 | 3 | 1.320 | 1.680 |

| Min (Ghz) | Max (GHz) | Divide | Post Divide Min (Ghz) | Max (GHz) | MOD | Review Multi-plication | Overlap | |
|---|---|---|---|---|---|---|---|---|
| 6.160 | 7.840 | 1 | 2.310 | 2.940 | 0.667 | 2.667 | | |
| 6.160 | 7.840 | 1 | 1.848 | 2.352 | 0.333 | 3.333 | 42.000 | MHz |
| 6.160 | 7.840 | 1 | 1.680 | 2.138 | 0.667 | 3.667 | 290.182 | MHz |
| 6.160 | 7.840 | 1 | 1.422 | 1.809 | 0.333 | 4.333 | 129.231 | MHz |
| 6.160 | 7.840 | 1 | 1.320 | 1.680 | 0.667 | 4.667 | 258.462 | MHz |
| 6.160 | 7.840 | 2 | 1.155 | 1.470 | 0.333 | 5.333 | 150.000 | MHz |
| 6.160 | 7.840 | 2 | 0.924 | 1.176 | 0.667 | 6.667 | 21.000 | MHz |

TABLE 1-continued

| | | | | | | | | |
|---|---|---|---|---|---|---|---|---|
| 6.160 | 7.840 | 2 | 0.840 | 1.069 | 0.333 | 7.333 | 145.091 | MHz |
| 6.160 | 7.840 | 2 | 0.711 | 0.905 | 0.667 | 8.667 | 64.615 | MHz |
| 6.160 | 7.840 | 2 | 0.660 | 0.840 | 0.333 | 9.333 | 129.231 | MHz |

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an injection locked oscillator (ILO) system which is structured to provide a local oscillator (LO) frequency and a Digitally Controlled Oscillator (DCO) frequency or Voltage Controlled Oscillator (VCO) frequency which is not harmonically related by an integer multiple to an output frequency, wherein the ILO system comprises an injection locked divider which utilizes a back gate voltage.

2. The structure of claim 1, wherein the ILO system multiplies the DCO frequency by a non-integer.

3. The structure of claim 2, wherein the injection locked divider utilizes the back gate voltage in fully depleted silicon on insulator (FDSOI) technologies.

4. A structure comprising an injection locked oscillator (ILO) system which is structured to provide a local oscillator (LO) frequency and a Digitally Controlled Oscillator (DCO) frequency or Voltage Controlled Oscillator (VCO) frequency which is not harmonically related by an integer multiple to an output frequency, wherein the ILO system comprises two subsystems including (i) an input divider and (ii) an ILO calibration which tunes a frequency of an ILO by controlling an ILO regulator and an ILO back gate, based on inputs from an ILO time to digital converter (TDC) and a calibration counter.

5. The system of claim 4, wherein a lowest frequency clock, at an output of the input divider, is distributed and higher speed clocks, at an output of the ILO, are generated locally at the ILO to minimize errors due to clock mismatch.

6. The system of claim 4, wherein the input divider divides a differential clock input to generate a differential output clock for injection into the ILO.

7. The system of claim 4, wherein:
when no injection clock is supplied from the input divider, the ILO will free run to allow a startup calibration to set an initial frequency, and
when a clock is supplied from the input divider that is within a lock range for the free running frequency, the ILO will lock to generate a frequency three times an input frequency.

8. The system of claim 7, wherein the ILO TDC measures modulation to allow the ILO calibration to tune the free running frequency of the ILO, thereby minimizing modulation.

9. The system of claim 4, wherein the calibration counter counts three ILO clock cycles per injection clock and a sampler samples this count using the clock from an ILO GRO to achieve a sampling that is unsynchronized to the clock of the ILO.

10. The system of claim 4, wherein the ILO calibration determines a difference in period caused to the ILO by an injection pulse and acts to minimize the period difference by tuning a free running frequency of the ILO to match a locked value of the ILO.

11. The system of claim 10, wherein the calibration counter and sampler measure a ratio of a reference clock frequency to the ILO frequency to allow the ILO calibration to set the free running frequency as accurately as possible before the ILO is locked.

12. The system of claim 4, wherein, in startup mode, the calibration counter is used by the ILO calibration to determine a ratio between clock frequencies of the ILO and a reference clock to allow the ILO clock to be set to a desired multiple.

13. The system of claim 4, wherein the ILO regulator is controlled by the ILO calibration to coarsely set an output frequency of the ILO by controlling Vdd supplied by the ILO regulator and the ILO back gate is controlled by the ILO calibration to finely set the free running frequency of the ILO.

14. The system of claim 1, wherein the integer multiple is a rational number which is a positive integer multiple.

15. A method comprising calibrating a free running frequency of an ILO using a calibration counter to compare a frequency of the ILO with a desired frequency output from a frequency control word (FCW), wherein
an output from the calibration counter determines whether the ILO is running fast or slow, and
edges of the frequencies of the ILO are accumulated and binary searches are performed on coarse (Vdd) and fine (back gate) controls to set an optimal frequency.

16. The method of claim 15, wherein, in a background calibration mode:
injection of an input signal is enabled via an input divider and the calibration counter samples the output of the ILO periodically to generate a histogram of how much time is spent in an injection cycle or free running cycles; or
a clock injection into the ILO is enabled via the input divider and an output is periodically sampled to generate the histogram of how much time is spent in the injection cycle or free running cycles.

17. The method of claim 16, wherein with no injection, cycles are a natural oscillation frequency of the ILO, with a number of clock cycles counted in each state being roughly equal.

18. The method of claim 16, wherein information of the histogram is passed to a calibration logic that determines appropriate changes to back gate voltages to maintain the ILO at an optimum state, wherein an ILO TDC sampling clock is uncorrelated with the clock of the ILO.

19. The structure of claim 1, wherein the injection locked divider utilizes the back gate voltage in fully depleted silicon on insulator (FDSOI) technologies.

* * * * *